OR 3,246,159

April 12, 1966 J. I. PANKOVE 3,246,159

MODULATORS FOR LIGHT RADIATION EMPLOYING CARRIER INJECTION

Filed April 30, 1962

2 Sheets-Sheet 1

INVENTOR
JACQUES I. PANKOVE
BY Floyd M. Harris
Attorney

MODULATORS FOR LIGHT RADIATION EMPLOYING CARRIER INJECTION

Filed April 30, 1962 2 Sheets-Sheet 2

INVENTOR.
JACQUES J. PANKOVE
BY
Floyd M. Harris
Attorney 3,246,159
Patented Apr. 12, 1966

3,246,159

MODULATORS FOR LIGHT RADIATION EMPLOYING CARRIER INJECTION

Jacques I. Pankove, Princeton, N.J., assignor to Radio Corporation of America, a corporation of Delaware Filed Apr. 30, 1962, Ser. No. 191,157
25 Claims. (Cl. 250—199)

This invention relates generally to improved translators for electromagnetic radiation and particularly to improved modulators for infrared energy.

It is known that infrared radiation of wavelengths longer than a threshold value is transmitted with very low attenuation through semiconductors such as germanium and silicon, for example. The above limit or threshold value of wavelength is that at which hole-electron pairs are generated by optical excitation. The threshold value depends on the particular material used. Controlled absorption of such radiation may be effected in such semiconductors by free charge carriers in the path of said radiation through said semiconductors. This absorption of photons of longer than the threshold wavelength radiation is believed to be due to the process of an energy exchange between the radiation photons and the charge carriers. The number of charge carriers in the path of the radiation determines the degree of energy absorption. The free charge carriers can be injected into the semiconductor, for example, by properly biased injection electrodes, by charged-particle-beam injection, or by excitation of the semiconductor by incident radiation having a wavelength shorter than the threshold wavelength. Either or both electrons or holes can be injected into the semiconductor for absorption of the longer-than-threshold wavelength radiation to be modulated. However, it is found that in most semiconductors free carrier absorption by holes is much greater than that by electrons.

Previous structures for utilizing such free charge carrier absorption of infrared radiation generally have employed flat cylindrical semiconductor plates having either a point contact electrode or a large area rectifying junction therein, and wherein substantially the entire volume of the plate is irradiated by the incident radiation to be modulated. In alternative arrangements further irradiation of the entire semiconductor plates by light of less than the threshold wavelength is substituted for the rectifying or other injecting electrodes to create therein the free charge carriers. Such prior devices have provided very limited absorption modulation of incident infrared energy due to the difficulty of establishing a sufficiently high density of free charge carrier in the path of the transmitted energy. Another difficulty with such devices has been the lack of uniformity of free charge carrier density in the transmission path. Attempts to improve the percentage of modulation by providing multiple passes of the transmitted radiation through the free charge carrier region in the semiconductor have not materially improved the modulation efficiency. Severe radiation collimation problems greatly limit the radiation available for modulation. In semiconductor structures employing large N-type and P-type regions separated by rectifying junction, the frequency response suffers from a relatively long carrier lifetime. In such devices carrier diffusion must be minimized. Also the presence of large numbers of free holes in the large P-type region greatly reduces the percentage of modulation obtainable, since they provide an undesirable constant signal attenuation.

An object of the instant invention is to provide improved structures for translating electromagnetic radiation.

Another object of the invention is to provide improved electromagnetic energy modulators.

A further object of the invention is to provide improved infrared modulators which reflect incident radiation energy at a substantially different solid angle than the incident radiation energy.

An additional object of the instant invention is to provide improved infrared radiation modulators in which the modulated radiation is transmitted through said modulators in a substantially different solid angle than the incident radiation energy.

A further object of the invention is to provide improved infrared radiation modulators in which free charge carriers are injected into a localized region of a semiconductor body to optimize the free charge carrier density in the path of the radiation to be modulated.

The foregoing and other objects and advantages are accomplished in accordance with the invention by employing, for example, a Weierstrass sphere of semiconductor material for the radiation modulation element. A Weierstrass sphere is a truncated spherical body having a height $$h=r\left(1+\frac{1}{n}\right)$$

wherein $r$ is the radius and $n$ is the index of refraction of the material comprising the body. Free charge carriers, which may be either electrons or holes, but are preferably holes, are injected into the semiconductor substantially only in the immediate localized region adjacent the Weierstrass point (i.e., the center of the flat face) of the sphere. Such injection preferably is accomplished by a small injecting electrode such as a P–N junction located at the Weierstrass point, or alternatively, by incident free-charge-carrier-injecting radiation, having a wavelength less than the threshold value, focused in the semiconductor material in the localized region immediately adjacent to said point. Incident radiation of wavelength longer than the threshold value is applied to the Weierstrass sphere in a manner also to focus the incident radiation at the immediate vicinity of the Weierstrass point whereby said radiation is subjected to an optimum density of free charge carriers for modulation thereof. The density of the injected free charge carriers, and hence the absorption modulation of the incident longer wavelength radiation is controlled in a first embodiment by a signal applied to the injecting electrode. In an alternative embodiment, the modulation control signal may be applied to an electromechanical transducer for, or to the energizing source for, the shorter wavelength carrier-injecting radiation, for modulating said carrier injecting radiation. A typical embodiment of the improved modulator in accordance with the invention provides absorption modulation of infrared energy of modulation percentages of the order of 50% to 75% over a wavelength spectrum from 6.5 to over 10 microns, for example. Since the effective radiation modulation region of high carrier density can be quite small, the lifetimes of the carriers can be very short with resultant advantages of greately improved modulation frequency response.

The invention will be described in greater detail by reference to the accompanying drawings wherein.

Similar reference characters are applied to similar elements throughout the drawings.

Figures 1, 2:
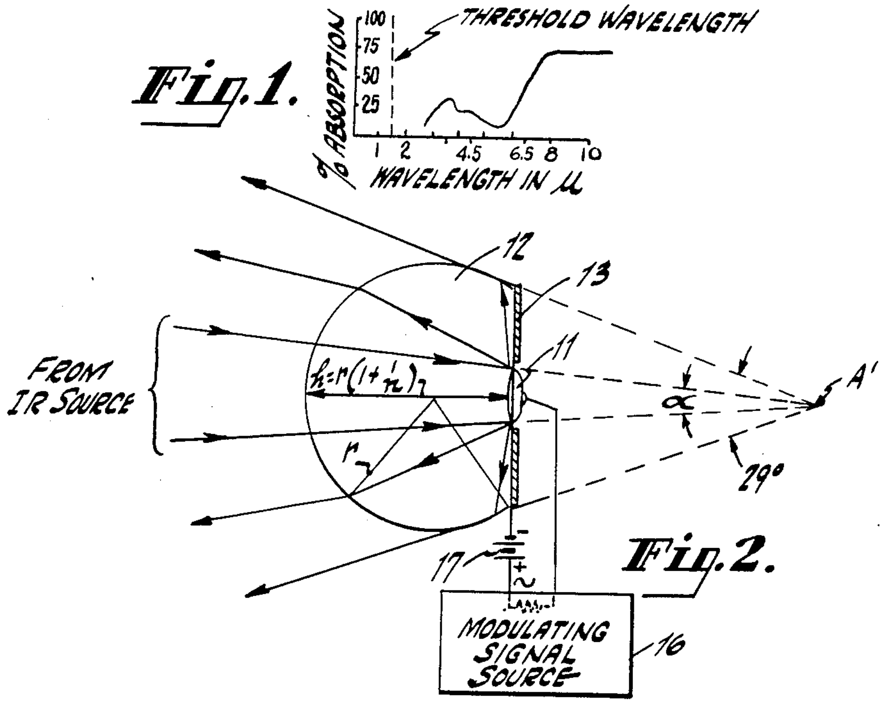
FIG. 1 is a graph illustrative of the modulation characteristics of a typical device in accordance with the invention as a function of radiation wavelength.
FIG. 2 is a schematic illustration of a Weierstrass sphere having a charge carrier injecting electrode in accordance with the invention.

FIG. 2 illustrates an embodiment of the invention wherein the free charge carriers are injected by an electrode 11 (at a P–N junction) to which a modulating voltage is applied. The Weierstrass sphere 12 in this example is of N-type germanium. It is supported from a metallic plate or disc 13 to which the sphere 12 is soldered with N-type solder to form an ohmic connection between the disc 13 and sphere 12. In this specific example the sphere radius *r* is 200 mils (i.e., 0.2 inch). The disc 13 has at its center an opening that is 40 mils in diameter.

The electrode 11 is of a P-type inducing material such as indium (10 mils in diameter) which is put into the 40 mil opening and alloyed with the germanium to form a P–N junction.

The infrared radiation to be modulated is projected from a suitable source through the sphere 12 to the P–N junction at the center of the Weierstrass plane (at the electrode 11). The infrared radiation that is not absorbed by the free carriers is reflected, and all rays reflected from the center of the Weierstrass plane are diffracted by the spherical germanium-air interface so that they seem to come from a virtual point A′ that is at a distance $nr$ from the center of the sphere 12, where $r$ is the radius of the sphere and $n$ is the index of refraction of the sphere material, germanium in the present example. A characteristic of the Weierstrass sphere is that rays issued from the center of the Weierstrass plane (from the Weierstrass point) within a 180 degree solid angle come out of the sphere as a 29 degree beam with the apex of the cone at the virtual point A′.

In the example illustrated in FIG. 2 the injected free charge carriers at the P–N junction are irradiated with the infrared radiation within a solid angle $\alpha$ which is less than the 29 degree solid angle of the resulting modulated radiation.

In the embodiment of FIG. 2 the infrared radiation is modulated by the injection of holes. The holes are the free charge carriers that absorb the infrared radiation, the amount of absorption increasing as the number of holes are increased. A modulating signal source, represented by block 16, is connected to apply voltage between the sphere 12 and the electrode 11. In some cases it may be preferred to include a direct-current bias as by the inclusion of a battery 17.

If the modulating source 16 is a pulse voltage source, for example, the biasing source 17 usually would be omitted. The pulse polarity would be such that each pulse drives the electrode 11 positive with respect to the sphere 12 to inject a large number of holes in the region of the P–N junction. In this operation example, the modulated infrared radiation is a minimum for the duration of each modulating pulse.

If the modulating signal is to be speech signal, for example, the direct-current bias 17 preferably is included with a bias value selected to inject a number of holes that is a quantity intermediate the maximum and minimum quantity of holes to be injected during modulation.

It has been assumed that the modulated infrared radiation is reflected from the electrode 11, i.e., from the indium-germanium interface in the specific example described. Actually, the P–N junction itself may be the reflecting boundary if the thin P-type layer is so heavily doped as to have metallic reflectivity in the wavelength range used. In conventional P–N junction production the surface of electrode 11 does have a mirror characteristic so that it reflects infrared radiation. This reflecting surface may be formed so that it is flat and acts as a plane mirror. Preferably, it is formed with a rough surface or formed to be convex facing the infrared source so that it scatters the infrared radiation into a hemispherical solid angle. Thus, the solid angle of the modulated infrared radiation will be large enough so that the infrared source does not intercept much of the modulated radiation.

An example of results obtained in operating the embodiment of FIG. 2 is illustrated in FIG. 1 with data taken at room temperature, with 0.3 ohm centimeter N-type germanium, and with 0.3 ampere flowing to the electrode 11, the absorption of infrared radiation of wavelength between 8 microns and 10 microns was 75%; the absorption of infrared radiation of 6.5 micron wavelength was about 50%. The graph of FIG. 1 shows the percent absorption of the infrared radiation of different wavelengths, including those mentioned above, for the above-stated condition of 0.3 ampere flowing to electrode 11.

Figure 3:
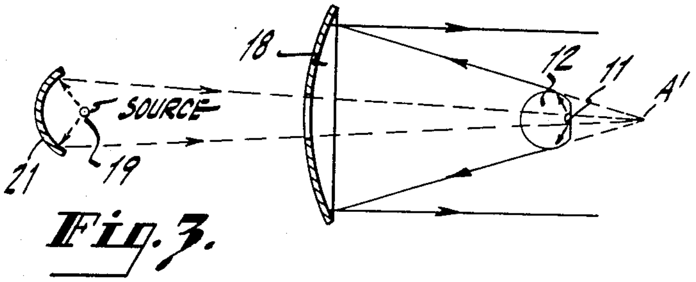
FIG. 3 is a schematic diagram of a Weierstrass sphere such as shown in FIG. 2 in a system providing reflection-type modulation of incident infrared energy.

FIG. 3 illustrates the use of a parabolic reflector 18 for beaming the modulated infrared radiation obtained by the embodiment of FIG. 2. The Weierstrass sphere 12 is positioned with respect to the reflector 18 so that its virtual point A′ is located at the focus of reflector 18. Thus, the modulated infrared rays are reflected as parallel rays to produce a beam suitable for propagation to a remote receiver.

The infrared radiation to be modulated may be supplied from a source 19 located with respect to a mirror 21 that focuses the infrared radiation through an opening in reflector 18 to a small spot substantially within the area of the injected free charge carriers opposite the electrode 11.

Figure 4:
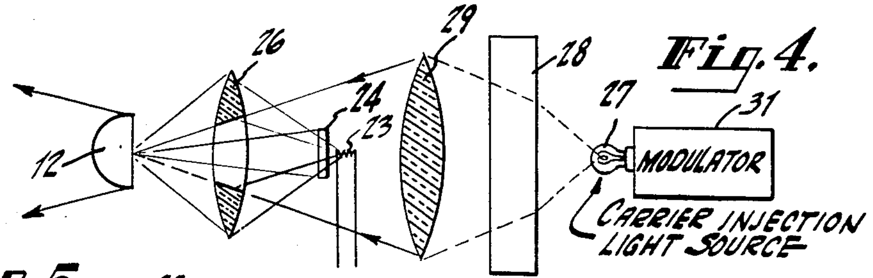
FIG. 4 is a schematic illustration of another embodiment of the invention employing radiation-injected free charge carriers in the semiconductor radiation modulator.

FIG. 4 shows an embodiment of the invention in which the free charge carriers are injected by excitation of the semi-conductor by incident radiation having a wavelength shorter than the threshold wavelength. In FIG. 4 the Weierstrass sphere 12 is a semiconductor such as N-type germanium, for example. The threshold wavelength for germanium is 1.5 microns.

A source of infrared radiation to be modulated is indicated at 23. A filter 24, such as a germanium filter, permits only infrared radiation of a greater wavelength than the threshold value to be directed to the Weierstrass sphere. The radiation passed by filter 24 may cover a spectral range from 8 microns to 10 microns, for example. The radiation from source 23 is focused on the germanium at the center of the Weierstrass plane, i.e., at the Weierstrass point, by a lens 26. Except for about 30 percent of the radiation which will be reflected by each germanium-air interface, the infrared radiation will pass into the sphere 12 and be transmitted in a cone of radiation having a solid angle of 29 degrees. Thus, assuming there is no absorption of the infrared radiation by free charge carriers, about 50% of the radiation focused on the sphere 12 by the lens 26 will be transmitted. The amount of radiation to be transmitted may be substantially increased by coating the Weierstrass sphere with an anti-reflecting layer, such as for example a 2 micron thick layer of silicon dioxide.

This radiation may be modulated by varying the amount of light from a carrier injecting light source 27. Light from source 27 passes through a water filter 28 to remove all light having a wavelength greater than the threshold value. The filtered light, now of a wavelength less than the threshold value, is focused by a lens 29 on the germanium at the Weierstrass point of sphere 12. There is an opening in the center of the lens 26 to permit an undiffracted passage of the light from the lens 29.

The light from source 27 injects free charge carriers into the semiconductor by optical excitation of electron-hole pairs. The greater the intensity of the light from source 27, the greater the number of electron-hole pairs that are created, and the greater the percentage absorption of the infrared radiation that is focused on the center of the Weierstrass plane. It will be understood that the infrared radiation to be modulated preferably is focused to an area that is inside (or does not extend substantially outside) the area on which the injecting light from source 27 is focused.

The light from source 27 may be modulated in various ways by suitable modulating means 31. The source 27 may be a tungsten lamp with a filament having a low thermal constant so that the light intensity will vary with variations in modulating current passed through the filament. Or, as another example, the light source 27 may be a zirconium arc lamp that is modulated by varying the current through it.

Figure 5:
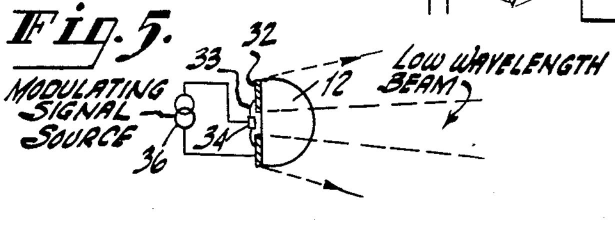
FIG. 5 is a schematic illustration of another embodiment of the invention wherein the density of free charge carriers in the semiconductor modulator is controlled by an applied electric field responsive to modulating signals.

FIG. 5 illustrates an embodiment of the invention in which injection of free carriers is achieved by electrostatic redistribution of the free carriers into a localized cluster at the Weierstrass point. The Weierstrass sphere 12, of a semiconductor such as N-type germanium, has a metallic disc 32 soldered to the Weierstrass plane with N-type solder to form an ohmic connection. The disc 32 has a hole in its center so that a dielectric material 33 may be formed on a center area of the Weierstrass plane. This central area may be slightly indented to scatter the incident radiation into a hemispherical solid angle. The material 33 may be silicon dioxide which may be formed on the center area by evaporating silicon monoxide to a thickness of the order of 2000 angstroms, for example. The layer of silicon monoxide soon changes into silicon dioxide. A second electrode 34 of gold, for example, is evaporated onto the dielectric opposite the Weierstrass point.

In operation, a source 36 of modulating signal applies a varying voltage between the electrodes 32 and 34. This causes positive free carriers (holes) to accumulate at the surface of the germanium at and close to the Weierstrass point. The more negative the modulating voltage, the greater the number of free carriers that accumulate at the surface. Thus, by focusing the infrared radiation to be modulated to the area of the free carriers (as in the FIG. 2 embodiment) this radiation is reflected and emitted as modulated radiation in a solid angle of 29 degrees. The modulated reflected radiation may leave the Weierstrass sphere in as narrow a solid angle as the incident radiation if the incident radiation is directed at a small angle to the principal axis of this optical system and if the surface is left planar at the Weierstrass point. The principal axis of the optical system is the axis normal to the Weierstrass plane at the Weierstrass point. Then the reflected radiation is transmitted in a direction symmetrical to the incident direction with respect to the principal axis.

If the modulating signal is an audio signal such as speech, for example, it may be preferred to have the modulating signal that is applied to electrodes 32 and 33 in the form of a carrier wave that is itself modulated by the audio signal. Alternatively, the electrode 34 may be a vibrating reed maintained at a constant potential, the charges being induced by the change in capacitance as the spacing between the electrode 34 and the sphere 12 is varied.

Figure 6:
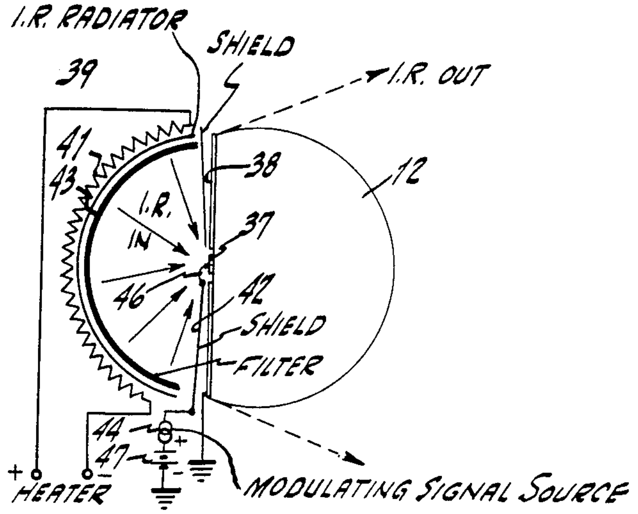
FIG. 6 is a schematic illustration of a further embodiment of the invention wherein incident infrared radiation is transmitted through the radiation modulating semiconductor elements.

FIG. 6 shows an embodiment of the invention utilizing injection of free charge carriers by an electrode 37 at a P–N junction, and provided with a source of infrared radiation opposite the Weierstrass plane. In the example illustrated, the Weierstrass sphere 12 is of N-type germanium. The electrode 37 is a layer of semi-transparent aluminum which is alloyed with the germanium to form a P–N junction.

A metallic disc 38 having a hole in its center is soldered by N-type solder to the plane of the sphere 12 to provide an ohmic connection.

The infrared radiation to be modulated and transmitted has as its source a hemi-spherical metallic cup 39 which is centered about the Weierstrass point. The cup 39 is heated by an electric heater element 41 to a proper temperature for infrared radiation.

The infrared radiation is concentrated onto the semi-transparent electrode 37 and the region of the Weierstrass point where it is absorbed by an amount depending upon the number of free charge carriers present at that point.

A metallic shield 42 in the form of shallow cone with an opening at its apex may be provided so that infrared radiation strikes only the region of the Weierstrass point. A filter 43 in the form of a hemisphere, and of the same material as the sphere 12, may be provided to filter out radiation of unwanted wavelengths.

For varying the number of free charge carriers present at the germanium surface opposite the injecting electrode 37, the modulating signal from a source 44 is applied between electrodes 37 and 38. The connection from source 44 to the electrode 37, in the example shown, is through the shield 42 and a short conductor 46. As in the embodiment of FIG. 2, a bias source 47 may be provided in series with the modulating signal source 44.

In FIG. 6 the infrared radiation is modulated by the same action as described in connection with FIG. 2, i.e., the modulating signal varies the number of free charge carriers (holes) in the region of the Weierstrass point and thereby varies the percentage of the infrared radiation that is absorbed. In FIG. 6, however, the infrared radiation passes through the injecting electrode 37 to the region of free charge carriers at the Weierstrass point. The modulated infrared radiation then is transmitted from the sphere 12 in a 29 degree solid angle. It will be seen that the infrared radiation from the source 39 to the Weierstrass point is within a solid angle of almost 180 degrees, thus providing efficient use of the infrared source.

Figure 7:
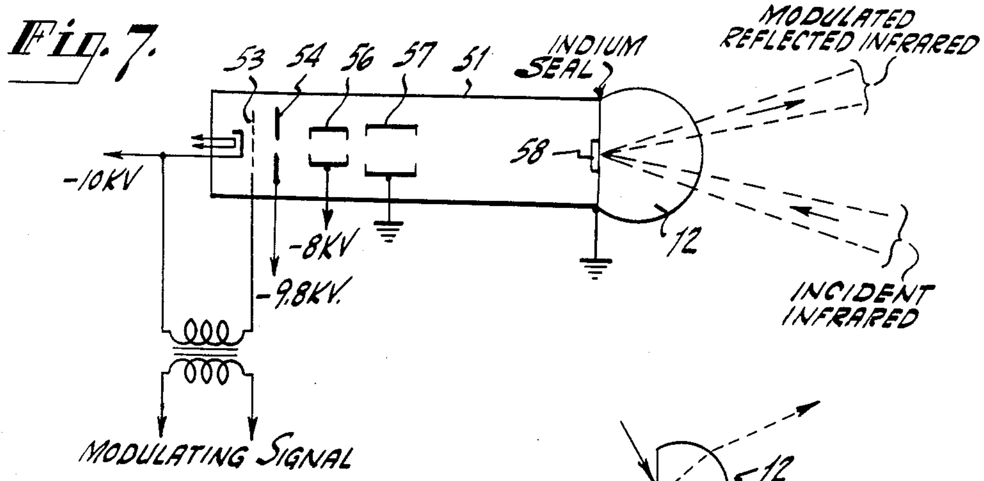
FIG. 7 is a schematic diagram illustrative of the injection of free charge carriers into the semiconductor radiation modulating element by means of modulated charge particle beams.

FIG. 7 illustrates an embodiment of the invention wherein free carriers are injected at the Weierstrass point by electron bombardment. In the example illustrated an electron beam is generated in a cathode ray type tube for bombarding the Weierstrass point of the sphere 12 which is of N-type germanium. The cathode ray tube comprises an evacuated glass envelope 51 in which there is an electron gun comprising a cathode 52, a control grid 53, a screen grid 54, a first anode 56 and a second anode 57. Certain operating voltages for the several electrodes are indicated by way of example.

The end of the glass envelope 51 remote from the gun is open so far as the glass structure is concerned, but is closed by the abutting Weierstrasse sphere which is sealed to the glass by a suitable seal such as an indium seal.

Opposite the Weierstrass point there is a thin film 58 of aluminum which is transparent to the electron beam but which is a reflector of infrared rays. In the example illustrated it acts as a plane mirror that reflects without scattering.

The infrared radiation to be modulated is focused on the Weierstrass point where the free charge carriers are to be concentrated. It is reflected from the film 58 and emerges from the sphere 12 in a narrow solid angle that is the same as the angle of incidence. In order that the reflected beam will not be intercepted by the infrared ray source 59, the source 59 is positioned to one side of the princpal axis of the optical system as illustrated. The principal axis of the optical system is the axis normal to the Weierstrass plane at the Weierstrass point.

It may be preferred to make the aluminum-germanium interface a scattering interface by sandblasting the germanium surface on which the aluminum 58 is to be evaporated. After the sandblasting the roughened germanium surface is etched to remove damaged material. The thin aluminum surface 58 is then laid down. In this case the incident infrared rays are scattered at the surface 58 so that the modulated reflected infrared rays emerge from the sphere 12 at a 29 degree solid angle as explained in connection with previously described embodiments of the invention.

The injection of and the variation in the number of free charge carriers is achieved by the electron beam which may be varied either in intensity or energy as a function of a modulating signal. In the example illustrated, the modulating signal varies the potential of the control electrode with respect to the cathode to vary the intensity of the electron beam. The beam intensity may be varied between 0 and 30 micro-amperes, for example. The number of free charge carriers at the Weierstrass point becomes greater when the number of electrons in the bombarding beam becomes greater whereby the absorption of the incident infrared radiation becomes greater. The variation of the beam energy can be obtained by modulating the potential of the cathode-grid structure with respect to the anodes.

Figure 8:
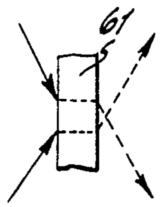
FIGS. 8 and 9 are schematic illustrations of specific characteristics of semiconductor modulators explained in greater detail hereinafter.
Figure 9:
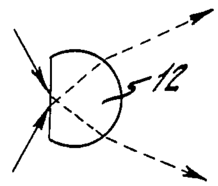

An advantage in using semiconductor material in the form of a Weierstrass sphere as the modulating element rather than using a slice of semiconductor having parallel faces, for example, is illustrated in FIGS. 8 and 9. As shown in FIG. 8 incident rays will leave the semiconductor slice 61 at the same angle as the angle of incidence. However, as shown in FIG. 9, rays leaving the Weierstrass sphere 12 will leave at a smaller angle than the angle of incidence. By using a modulating element in the form of a Weierstrass sphere, the output radiation is conveyed into a smaller angle so that there is a substantial gain in the intensity of the radiation leaving the sphere as compared with prior art modulators. Furthermore, the use of the Weierstrass sphere makes it practical to concentrate the radiation to be modulated at a small region in the semiconductor where the free charge carriers can be concentrated. The result is that a good percentage modulation of infrared radiation may be obtained. Also, by using the Weierstrass sphere the modulated radiation may be beamed by a reflector for transmission if desired.

While germanium has been assumed as the semiconductor material for the Weierstrass sphere, other semiconductors, such as silicon and GaAs, which have a valence band structure similar to germanium, may be used. Also, the material may be of high resistivity P-type. In this case the injected carriers are electrons. However, because of space charge neutrality requirements, there appears, in the injection region, an equal concentration of holes. The holes cause the high absorption effect.

What is claimed is:

1. A radiation translator comprising a semiconductor body substantially transparent to radiation within a selected frequency spectrum, means for altering said transparency of said body within said spectrum in accordance with a signal, said means comprising means for injecting charge carriers into said body at rates responsive to said signal, radiation source means external of said body for irradiating said injected carriers with said radiation within a first solid angle, and means for deriving said radiation modulated by said signal from said body over a substantially different solid angle than said first angle.

2. Apparatus according to claim 1 wherein said radiation is transmitted through said body, said radiation incident upon said body covering a larger solid angle than the radiation transmitted by said body.

3. Apparatus according to claim 1 wherein said source radiation is reflected from said body, said radiation incident upon said body covering a smaller solid angle than the radiation reflected by said body.

4. An infrared radiation modulator comprising a semiconductor body substantially transparent to and refractive of infrared radiation, means for changing the infrared absorption of said body in response to a signal, said means comprising means for injecting charge carriers into a localized region of said body at rates responsive to said signal, means for predominantly irradiating said region with infrared radiation within a first solid angle, and means for deriving said infrared radiation modulated by said signal and refracted from said body over a substantially different solid angle than said first angle.

5. An infrared radiation modulator comprising a semiconductor body substantially transparent to and refractive of infrared radiation, means for changing the infrared absorption of said body in response to a signal, said means comprising means for injecting charge carriers into a localized region of said body at rates responsive to said signal, means for predominantly irradiating said region with infrared radiation within a first solid angle, and means for deriving said infrared radiation modulated by said signal and refracted from said body over a substantially larger solid angle than said first angle.

6. An infrared radiation modulator comprising a semiconductor body substantially transparent to and refractive of infrared radiation, means for changing the infrared absorption of said body in response to a signal, said means comprising means for injecting charge carriers into a localized region of said body at rates responsive to said signal, means for predominantly irradiating said region with infrared radiation within a first solid angle, and means for deriving said infrared radiation modulated by said signal and refracted from said body over a substantially smaller solid angle than said first angle.

7. An infrared radiation modulator including a semiconductor body substantially transparent to infrared radiation comprising a Weierstrass sphere having spherical and flat portions, means for changing the infrared transparency of said body in accordance with a signal, said means comprising means for injecting charge carriers into said body at rates responsive to said signal, means for irradiating said injected carriers with infrared radiation, and means for deriving said infrared radiation modulated by said signal from said body.

8. Apparatus according to claim 7 wherein said injecting means comprises an electrode located at the Weierstrass point of said phere.

9. Apparatus according to claim 8 wherein said electrode is convex to incident radiation and said radiation is reflected and diffused by said electrode within said sphere.

10. Apparatus according to claim 7 including means for focusing said modulated radiation into a beam.

11. Apparatus according to claim 10 wherein said irradiating means, said sphere and said focusing means are disposed on a common axis.

12. Apparatus according to claim 11 wherein said focusing means is disposed between said irradiating means and said sphere and is apertured to permit said irradiation of said sphere.

13. An infrared radiation modulator including a semiconductor body substantially transparent to infrared radiation comprising a Weierstrass sphere having spherical and flat portions, means for changing the infrared transparency of said body in accordance with a signal, said means comprising an electrode on said flat portion of said body for injecting charge carriers into said body at rates responsive to said signal, means for irradiating said injected carriers predominantly in the body region immediately adjacent said electrode with infrared radiation, and means for deriving said infrared radiation modulated by said signal from said body.

14. An infrared radiation modulator including a semiconductor body substantially transparent to infrared radiation comprising a Weierstrass sphere having spherical and flat portions, means for changing the infrared transparency of said body in accordance with a signal, said means comprising a junction electrode on said flat portion of said body for injecting charge carriers into said body at rates responsive to said signal, means for irradiating said injected carriers predominantly in the body region immediately adjacent said electrode with infrared radiation, and means for deriving said infrared radiation modulated by said signal from said body.

15. An infrared radiation modulator including a semiconductor body substantially transparent to infrared radiation comprising a Weierstrass sphere having spherical and flat portions; means for changing the infrared transparency of said body in accordance with a signal, said means comprising a junction electrode on said flat portion of said body, and connections for a source of voltage connected to said electrode for injecting charge carriers into said body at rates responsive to said signal; means for irradiating said injected carriers predominantly in the body region immediately adjacent said electrode with infrared radiation, and means for deriving said infrared radiation modulated by said signal from said body.

16. An infrared radiation modulator including a semiconductor body substantially transparent to infrared radiation in a first frequency range comprising a Weierstrass sphere having spherical and flat portions, means for changing said infrared transparency of a restricted region of said body in accordance with a signal, said means including a source of radiation in a second frequency range for irradiating said body in the region immediately adjacent said restricted region for injecting charge carriers into said body at rates responsive to said signal, means for irradiating said injected carriers predominantly in said restricted region with infrared radiation in said first frequency range, and means for deriving said first frequency range infrared radiation modulated by said signal from said body.

17. An infrared radiation modulator comprising a semiconductor body substantially transparent to infrared radiation comprising a Weierstrass sphere, means for changing the infrared absorption of said body in response to a signal, said means comprising charged particle beam generating means for injecting charge carriers into a region of said body at rates responsive to said signal, means for predominantly irradiating said region with infrared radiation, and means for deriving said infrared radiation modulated by said signal from said body.

18. Apparatus according to claim 17 including means for varying the intensity of said charged particle beam in response to said signal.

19. Apparatus according to claim 17 including means for varying the velocity of said charged particle beam in response to said signal.

20. An infrared radiation modulator comprising a semiconductor body substantially transparent to infrared radiation, means for changing the infrared absorption of said body in response to a signal, said means comprising means for modifying the distribution of charge carriers in a restricted region of said body at rates responsive to said signal, said region being a reflector of infrared radiation, means for predominantly irradiating said region with infrared radiation by passing the radiation through said body, and means for deriving reflected infrared radiation modulated by said signal from said body.

21. An infrared radiation modulator comprising a semiconductor body substantially transparent to infrared radiation, means for changing the infrared absorption of said body in response to a signal, said means comprising means for injecting charge carriers into a restricted region of said body at rates responsive to said signal, substantially hemispherical means for predominantly irradiating said region with infrared radiation within a first solid angle, radiation shielding means for masking substantially all of said body except said region from said radiation, and means for deriving said infrared radiation modulated by said signal and transmitted through said body after being modulated over a substantially smaller solid angle than said first angle.

22. An infrared radiation modulator including a semiconductor body substantially transparent to infrared radiation comprising a Weierstrass sphere having spherical and flat portions, means for changing the infrared transparency of said body in accordance with a signal, said means comprising electrode means on said flat portion for injecting charge carriers into a restricted region of said body at rates responsive to said signal, substantially hemispherical infrared radiating means juxtaposed with said flat portion of said sphere for predominantly irradiating said injected carriers in said region with infrared radiation over a first solid angle, radiation shielding means for masking substantially all of said flat portion of said body except immediately adjacent said region from said radiation, and means for deriving said infrared radiation transmitted through said body and modulated by said signal over a substantially smaller solid angle than said first angle.

23. Apparatus according to claim 22 including a filter interposed between said radiating means and said body for rejecting an undesired portion of the infrared spectrum.

24. In a modulator comprising a lens system having as an element thereof a radiation translator comprising a semiconductor body substantially transparent to radiation within a selected frequency spectrum and having refractive surfaces, said lens system having one focal surface at a boundary of said body, and means to inject carriers into said body at said boundary.

25. A radiation translator comprising an aplanar semiconductor body substantially transparent to radiation within a selected frequency spectrum, and means for altering said transparency of said body within said spectrum in accordance with a signal, said means comprising means for injecting charge carriers into said body at rates responsive to said signal.

References Cited by the Examiner

UNITED STATES PATENTS

| | | | |
|---|---|---|---|
| 2,589,704 | 3/1952 | Kirkpatrick et al. | 250—199 |
| 2,683,794 | 7/1954 | Briggs et al. | 250—199 |
| 2,692,950 | 10/1954 | Wallace | 250—199 |
| 2,692,952 | 10/1954 | Lehovec | 250—199 |
| 2,861,165 | 11/1958 | Aigrain et al. | 250—199 |
| 2,929,923 | 3/1960 | Lehovec | 250—199 |
| 3,059,117 | 10/1962 | Boyle et al. | 250—199 |
| 3,111,587 | 11/1963 | Rocard | 250—199 |
| 3,121,203 | 2/1964 | Heywang | 250—199 |

OTHER REFERENCES

Gibson: Electronics, October 1954, pp. 155–157.

Winogradoff: IBM Tech. Disclosure Bulletin, vol. 3, No. 10, March 1961, pp. 84, 85.

DAVID G. REDINBAUGH, *Primary Examiner.*